US008852959B2

(12) United States Patent
Talvacchio et al.

(10) Patent No.: US 8,852,959 B2
(45) Date of Patent: Oct. 7, 2014

(54) LOW TEMPERATURE RESISTOR FOR SUPERCONDUCTOR CIRCUITS

(75) Inventors: John J. Talvacchio, Ellicott City, MD (US); Erica C. Folk, Linthicum Heights, MD (US); Sean R. McLaughlin, Severn, MD (US); David J. Phillips, Richmond, VA (US)

(73) Assignee: Northrup Grumman Systems Corporation, Falls Church, VA (US)

( * ) Notice: Subject to any disclaimer, the term of this patent is extended or adjusted under 35 U.S.C. 154(b) by 212 days.

(21) Appl. No.: 13/330,270

(22) Filed: Dec. 19, 2011

(65) Prior Publication Data

US 2013/0157864 A1      Jun. 20, 2013

(51) Int. Cl.
| H01L 29/06 | (2006.01) |
| H01L 21/00 | (2006.01) |
| H01L 27/18 | (2006.01) |
| H01L 39/00 | (2006.01) |

(52) U.S. Cl.
CPC ................................ H01L 27/18 (2013.01); H01L 39/00 (2013.01)
USPC ...................... 438/2; 257/30; 257/34; 257/36

(58) Field of Classification Search
CPC ... H01L 27/18; H01L 23/53285; H01L 39/12; H01L 23/5228; H01L 23/532; H01L 27/0802; H01L 27/14636; H01L 35/225; H01L 39/00; H01L 39/2406; Y10S 420/901; Y10S 428/93; Y10S 505/805; C22C 14/00
USPC .................. 438/2; 505/800–933; 257/30–39, 257/661–663
See application file for complete search history.

(56) References Cited

U.S. PATENT DOCUMENTS

| 3,704,391 | A | 11/1972 | McConnell |
| 4,563,695 | A | 1/1986 | Tarutani et al. |
| 4,933,318 | A | 6/1990 | Heijman |
| 5,306,406 | A | 4/1994 | Palmieri et al. |
| 5,687,112 | A | 11/1997 | Ovshinsky |
| 6,468,642 | B1 | 10/2002 | Bray et al. |
| 2004/0223380 | A1 | 11/2004 | Hato |
| 2007/0069347 | A1* | 3/2007 | Lin et al. ...................... 257/673 |
| 2011/0089405 | A1* | 4/2011 | Ladizinsky et al. ............. 257/31 |

FOREIGN PATENT DOCUMENTS

| EP | 0 286 891 | 10/1988 |
| EP | 0 303 813 | 2/1989 |
| EP | 0 282 360 B1 | 11/1995 |

OTHER PUBLICATIONS

Gomersall, I. R. and Gyorffy, B. L. Variation of Tc with Electron-per-Atom Ratio in Superconducting Transition Metals and Their Alloys. Nov. 18, 1974, Physical Review Letters. vol. 33, No. 21.*

(Continued)

*Primary Examiner* — Julio J Maldonado
*Assistant Examiner* — Cory Eskridge
(74) *Attorney, Agent, or Firm* — Tarolli, Sundheim, Covell & Tummino LLP

(57) ABSTRACT

A integrated circuit and methods for fabricating the circuit are provided. The circuit integrates at least one circuit element formed from a material that is superconducting at temperatures less than one hundred milliKelvin and at least one resistor connected to the circuit element. The resistor is formed from an alloy of transition metals that is resistive at temperatures less than one hundred milliKelvin.

21 Claims, 4 Drawing Sheets

(56) References Cited

OTHER PUBLICATIONS

International Search Report for corresponding PCT/US2012/070066, completed Aug. 15, 2013 by Blaine R. Copenheaver.

Hypres: "*Niobium Integrated Circuit Fabrication, Process #03-10-45, Design Rules*"; Revision #24, Jan. 11, 2008 pp. 1-6.

Hulm, et al.: "*Superconducting Solid Solution Alloys of the Transition Elements*"; Physical Review, vol. 123, No. 5, Sep. 1, 1961, pp. 1569-1581.

Gamota: "*One, Two, Three—Zero Resistance!, In Defense Applications*"; IEEE Transactions on Magnetics, vol. Mag-17, No. 1, Jan. 1981, pp. 19-30.

* cited by examiner

LOW TEMPERATURE RESISTOR FOR SUPERCONDUCTOR CIRCUITS

TECHNICAL FIELD

The present invention relates generally to superconductors, and more particularly to methods of forming low temperature resistors.

BACKGROUND

Superconducting circuits are one of the leading technologies proposed for quantum computing and cryptography applications that are expected to provide significant enhancements to national security applications where communication signal integrity or computing power are needed. They are operated at temperatures <100 millikelvin. Materials used for electrical resistors in superconductor circuits operated at temperatures of 4.2K are not suitable for millikelvin operation since they have transitions to superconductivity—zero dc resistance—in the range between 4.2K and millikelvin. An example resistor material in this group is thin-film molybdenum. Other materials used for resistors at 4.2K are incompatible with processes in a silicon semiconductor foundry where it is desirable to fabricate superconducting control circuits. An example resistor material in this group is an alloy of gold and palladium (AuPd). Gold and copper are serious contaminants in silicon semiconductor foundries.

SUMMARY

In one aspect of the invention, a superconducting circuit is provided that integrates circuit elements formed from materials that are superconducting at temperatures less than one hundred milliKelvin and a resistors connected to the circuit elements. The resistor is formed from an alloy of transition metals that is resistive at temperatures less than one hundred milliKelvin.

In another aspect of the invention, a method is provided for creating a superconducting circuit. A first layer of material that is superconducting at temperatures less than one hundred milliKelvin is deposited on an insulating substrate. A second layer of material, formed from an alloy of transition metals that remains resistive at temperatures less than one hundred milliKelvin, is deposited. The second layer of material is in contact with the first layer of material.

In yet a further aspect of the invention, a superconducting circuit is provided including a circuit element formed from a superconducting material and a resistor connected to the circuit element. The resistor being formed from an alloy of transition metals having an atomic ratio selected such that a ratio of the number of valance electrons to atoms within the alloy is between about 5.35 and about 5.95.

DETAILED DESCRIPTION

Figure 1:
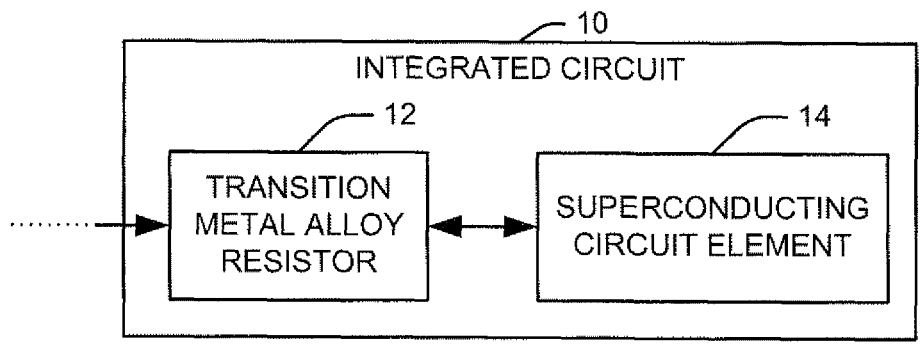
FIG. 1 illustrates a functional block diagram of an integrated circuit in accordance with an aspect of the present invention.

FIG. 1 illustrates a functional block diagram of an integrated circuit 10 containing elements (e.g., 12) that are resistive in accordance with an aspect of the present invention. While it will be appreciated by one of skill in the art that the resistivity of materials will generally vary with the operating conditions, particularly temperature, materials having substantially no resistance in the operating conditions of a circuit are referred to herein as "superconducting materials." Specifically, for the purpose of this document, a superconducting material is a material having a transition temperature ($T_C$) greater than an operating temperature of the circuit. In one implementation, the circuit can be used within an operating environment of a quantum circuit, such that the operating temperature is less than one hundred milliKelvin.

The circuit 10 includes a resistor 12, formed from an alloy of transition metals that has significant resistance in an operating environment of the circuit, and at least one circuit element 14 formed from a superconducting material that is superconducting in the operating environment. For example, the circuit element 14 can include any of a capacitor, a spiral inductor, a Josephson junction, or any of a number of other circuit elements commonly used in superconductor applications. The superconducting material can include any metal, carbon allotrope, alloy, ceramic, or other pure element known to exhibit superconductivity at low temperatures. Since a number of materials possess this property at milliKelvin temperatures, the superconducting material can be selected as a low cost material compatible with semiconductor processing techniques.

In accordance with an aspect of the present invention, the alloy of transition metals used to form the resistor 12 can be selected such that a total ratio of valance electrons to atoms within the alloyed material is within a specified range. Specifically, the alloy can exhibit normal conductivity when the ratio of valance electrons to atoms is greater than five and less than six. The term "transition metal" refers to any element found within the d-block of the periodic table, specifically those within Groups 3-11. By "valance electrons," it is meant the combined number of electrons in the outermost s subshell and the outermost d subshell of a given atom. Accordingly, for the purpose of this application, the number of valance electrons associated with each atom is equal to four for the Group 4 transition metals, five for the Group 5 transition metals, and so on.

In one implementation, the metals forming the alloy can be selected from a group comprising titanium, vanadium, zirconium, niobium, molybdenum, hafnium, tungsten, tantalum, and rhenium. The alloy can comprise two or more than two metals from that group, so long as the overall ratio of valance electrons to atoms falls between five and six. To ensure that the alloy has the desired resistivity in the milliKelvin range, an atomic ratio of the metals comprising the alloy can be selected to maintain a valance electrons to atoms ratio between about 5.35 to about 5.95. In one implementation, the resistor 12 is designed to provide a sheet resistance between one to ten ohms/square, and has a resistor-film thickness of twenty to two hundred nanometers. Accordingly, the film provides a resistivity of two to two hundred micro-ohm-cm at the milliKelvin operating temperature. In one implementation, the sheet resistance and thickness are selected to provide a resistivity between ten and fifty micro-ohm-cm.

The use of the class of transition metal alloys described herein allows for a number of advantages. The described alloys have a sheet resistance substantially independent of temperature in the 15 to 100 milliKelvin operating temperature range. They are non-magnetic and can be used in semiconductor processing equipment without the risk of contaminating the semiconductor equipment for other processes. As alloys, they are relatively insensitive to minor changes in impurities and defects, particularly when compared to pure elements. They are chemically stable at temperatures associated with semiconductor processing, typically 130 to 300° C. This includes stability against chemical reactions as well as interdiffusion with neighboring film layers. This chemical stability allows for a low vapor pressure and resistance to corrosion. Many of these alloys can be applied with thin-film deposition processes that are consistent with other portions of the superconducting circuit fabrication process, and can be patterned via a dry etching process. Finally, the selected group of materials contains members that are relatively common and low cost.

Figure 2:
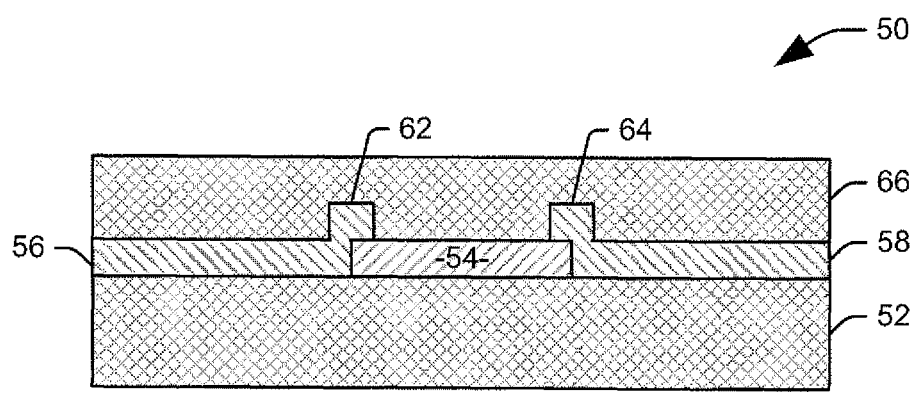
FIG. 2 illustrates an exemplary implementation of an integrated circuit assembly for use in milliKelvin temperature applications in accordance with an aspect of the present invention.

FIG. 2 illustrates an exemplary implementation of an integrated circuit assembly 50 for use in milliKelvin temperature applications in accordance with an aspect of the present invention. The integrated circuit assembly 50 comprises an insulating substrate 52 that serves as a structural support for the assembly. The substrate 52 can be formed from any material having sufficient rigidity to serve as a substrate for a semiconductor circuit assembly that is an insulator at milliKelvin temperatures. In one implementation, the substrate 52 comprises a silicon wafer.

A thin-film resistor 54 can be fabricated on the substrate. In accordance with an aspect of the present invention, the resistor layer 54 can be formed from an alloy of transition metals having a specific ratio of valance electrons to atoms. In the illustrated implementation, the resistor 54 is fabricated from an alloy of titanium and tungsten, with an atomic ratio of tungsten to titanium of approximately five to one (i.e., approximately 17% of the atoms comprising the alloy are tungsten and approximately 83% are titanium). The selected alloy provides a sheet resistance of 3.06 ohm/square, a thickness of 154 nm, and a resistivity of 47 micro-ohm-cm. It will be appreciated, however, that these quantities can vary, for example, from a composition of 67% tungsten/33% titanium to a composition of 98% tungsten/2% titanium. This corresponds to a range of compositions by weight of 88.5% tungsten/11.5% titanium to 99.5% tungsten/0.5% titanium.

First and second superconducting traces 56 and 58 can be fabricated on the substrate 52 proximate to the thin film resistor 54. The superconducting traces 56 and 58 can be formed from aluminum, niobium, or some other superconductor material. Each superconducting trace 56 and 58 is electrically connected to the thin-film resistor 54 at respective terminals 62 and 64. The entire assembly can be covered by a second insulating layer 66. The use of the titanium/tungsten alloy provides a number of advantages. The alloy exhibits a negligible temperature dependence in its resistance at low temperatures. The alloy is not magnetic and does not contaminate the equipment for semiconductor processing. Further, the deposition process can be performed at room temperature in argon gas, and a reactive ion etching process, using fluorine-based gases, is well established for the alloy.

Figure 3:
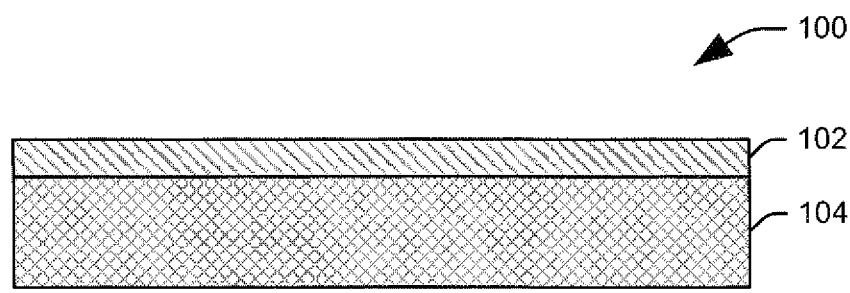
FIG. 3 illustrates a circuit structure in its early stages of fabrication.

Turning now to FIGS. 3-12, fabrication is discussed in connection with formation of a resistor for use in milliKelvin temperatures. It is to be appreciated that the present example is discussed with respect to a resistor, however, the methodology can be employed for forming a variety of different devices for use in a low temperature environment. FIG. 3 illustrates a circuit structure 100 in its early stages of fabrication. FIG. 3 represents the circuit structure after deposition of a superconducting material layer 102 on an insulating substrate 104. The superconductor material layer 102 can be deposited via any appropriate deposition technique including Low Pressure Chemical Vapor Deposition (LPCVD), Plasma Enhanced Chemical Vapor Deposition (PECVD), Atomic Layer Deposition (ALD), sputtering or spin on techniques. In the illustrated implementation, the superconducting material is deposited via sputtering. The material used to fabricate the superconductor material layer 102 can include, for example, aluminum, niobium, or some other superconductor material. The superconductor material layer 102 will reside on another, insulator layer 104 that provides mechanical support for the superconductor material layer 102.

Figure 4:
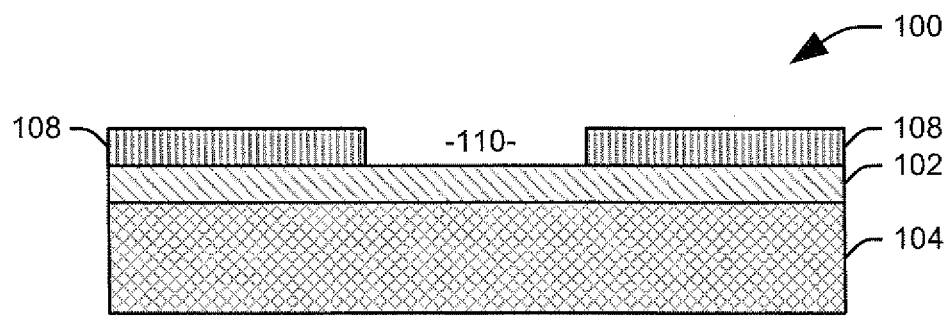
FIG. 4 illustrates a schematic cross-sectional view of the structure of FIG. 3 after a photoresist material layer has been patterned in accordance with an aspect of the present invention.

Next, as represented in FIG. 4, a photoresist material layer 108 is applied to cover the structure and is then patterned and developed to expose an open region 110 in the photoresist material layer 108. The photoresist material layer 108 can have a thickness that varies in correspondence with the wavelength of radiation used to pattern the photoresist material layer 108. The photoresist material layer 108 may be formed over the superconductor material layer 102 via spin-coating or spin casting deposition techniques, selectively irradiated and developed to form the open region 110. The developer utilized in the developing of the photoresist has no effect on the protective barrier layer 106.

Figure 5:
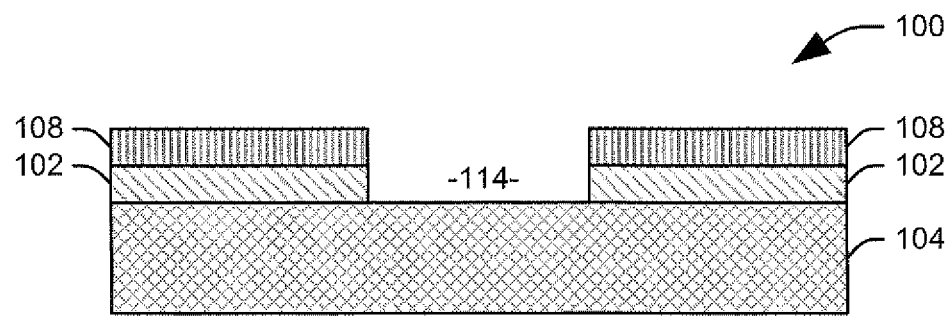
FIG. 5 illustrates a schematic cross-sectional view of the structure of FIG. 4 after the etch step to extend openings in the superconductor material layer in accordance with an aspect of the present invention.

FIG. 5 illustrates the circuit structure 100 after performing an etch step on the superconductor material layer 102 to form an opening 114 in the superconductor material layer 102. The etch can be, for example, a dry chlorine based plasma etch. For example, the superconductor material layer 102 can be anisotropically etched with a plasma gas(es) containing chlorine ions, in a commercially available etcher, such as a parallel plate Reactive Ion Etch (RIE) apparatus, Inductively Coupled Plasma (ICP) reactor or, alternatively, an electron cyclotron resonance (ECR) plasma reactor to replicate the mask pattern of the patterned photoresist material layer 108 to thereby create the opening pattern in the superconductor material layer 102. Alternatively, the etch may be a wet etch. Preferably, a selective etch technique is used to etch the superconductor material layer 102 at a relatively greater rate as compared to the patterned photoresist material layer and underlying layer (not shown).

Figure 6:
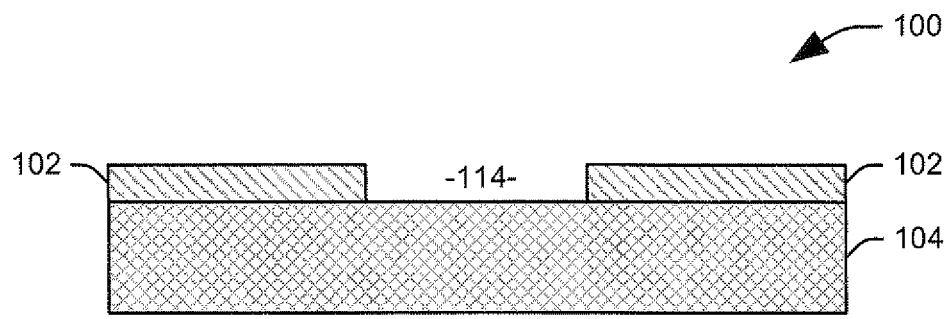
FIG. 6 illustrates a schematic cross-sectional view of the structure of FIG. 5 after undergoing a strip of the photoresist material layer in accordance with an aspect of the present invention.
Figure 7:
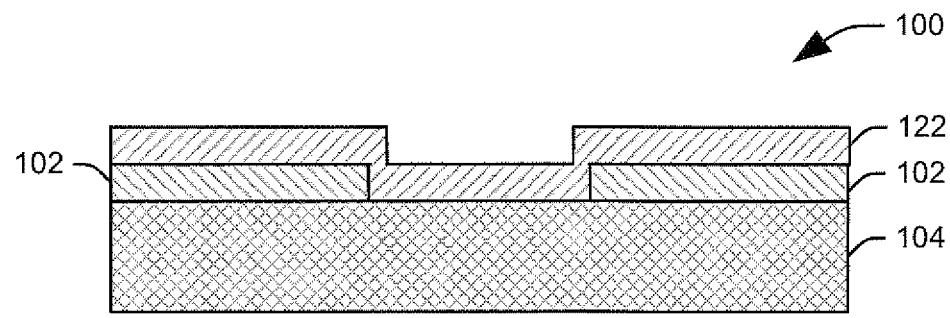
FIG. 7 illustrates a schematic cross-sectional view of the structure of FIG. 6 after depositing a layer of resistive material.
Figure 8:
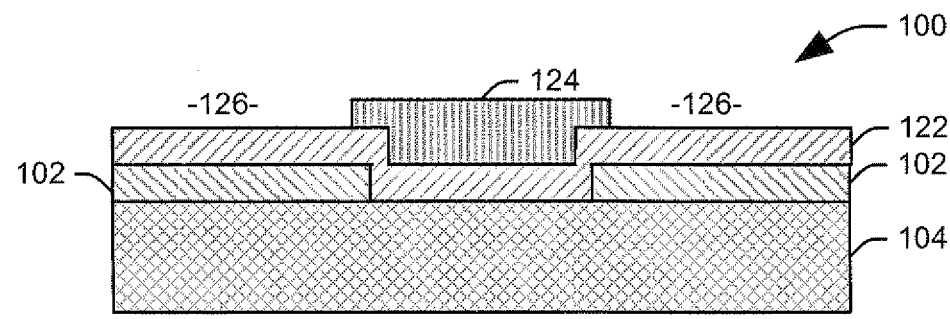
FIG. 8 illustrates a schematic cross-sectional view of the structure of FIG. 7 after a second photoresist material layer is applied to cover the structure and patterned and developed to expose open regions.

The photoresist material layer 108 is then stripped (e.g., via ashing in an $O_2$ plasma) so as to result in the structure shown in FIG. 6. FIG. 7 illustrates the circuit structure 100 after depositing a layer of resistive material 122 over the structure of FIG. 6. In the illustrated implementation, the layer of resistive material 122 is an alloy of titanium and tungsten having an atomic ratio of approximately five to one, tungsten to titanium, and the layer is deposited via sputtering. Next, as represented in FIG. 8, a second photoresist material layer 124 is applied to cover the structure and is then patterned and developed to expose open regions 126 in the second photoresist material layer 124.

Figure 9:
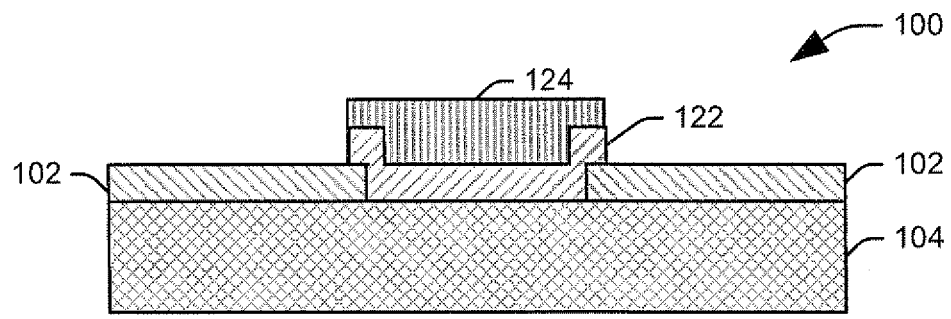
FIG. 9 illustrates a schematic cross-sectional view of the structure of FIG. 8 after the exposed resistive material is etched away to expose the layer of superconducting material.
Figure 10:
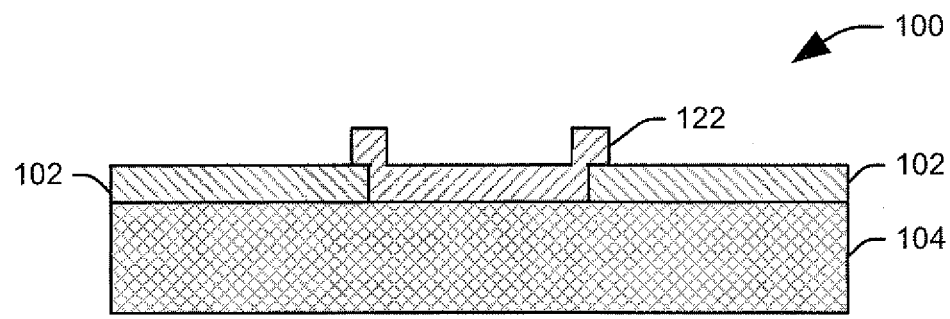
FIG. 10 illustrates a schematic cross-sectional view of the structure of FIG. 9 after the second photoresist material layer is stripped.
Figure 11:
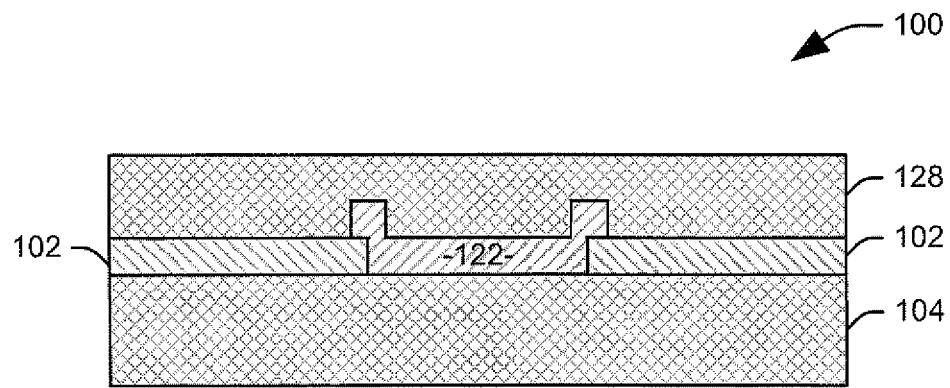
FIG. 11 illustrates a schematic cross-sectional view of the structure of FIG. 10 after an insulator layer has been deposited.

In FIG. 9, the exposed resistive material 122 is etched away to expose the layer of superconducting material 102. The etch step can be a dry etch or wet etch that employs an etchant which selectively etches the protective barrier layer 106 at a faster rate than the underlying superconducting material layer 102 and the overlying photoresist material layer 108. For example, resistive material 122 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the second photoresist material layer 124. In the illustrated implementation, the etching is performed via reactive ion etching with fluorine based gases. The second photoresist material layer 124 is then stripped to provide the structure shown in FIG. 10. In FIG. 11, the circuit structure 100 is then covered with a second insulating layer 128, such as silicon or silicon oxide.

What have been described above are examples of the invention. It is, of course, not possible to describe every conceivable combination of components or methodologies for purposes of describing the invention, but one of ordinary skill in the art will recognize that many further combinations and permutations of the invention are possible. For example, in the fabrication process illustrated in FIGS. 3-12, the resistive layer can be deposited prior to the deposition of the superconducting layer, such that the resistive layer is directly between the superconducting layer and the substrate at one or more locations. Accordingly, the invention is intended to embrace all such alterations, modifications, and variations that fall within the scope of this application, including the appended claims.

What is claimed is:

1. An integrated circuit comprising:
   a circuit element formed from a material that is superconducting at temperatures less than one hundred milliKelvin; and
   a resistor connected to the circuit element, the resistor being formed from an alloy of transition metals that is resistive at temperatures less than one hundred milliKelvin.

2. The integrated circuit of claim 1, an atomic ratio of the transition metals comprising the alloy being selected such that a ratio of the number of valance electrons to atoms within the alloy is between about 5.35 and about 5.95.

3. The integrated circuit of claim 1, wherein the transition metals comprising the alloy are selected as at least two of titanium, vanadium, zirconium, niobium, molybdenum, hafnium, tungsten, tantalum, and rhenium.

4. The integrated circuit of claim 3, wherein the alloy is an alloy of titanium and tungsten.

5. The integrated circuit of claim 4, wherein the alloy comprises an atomic ratio of approximately five atoms of tungsten to each atom of titanium.

6. The integrated circuit of claim 4, wherein the resistor is implemented as a thin film of the alloy.

7. A method for creating a superconducting circuit comprising:
   depositing a first layer of material that is superconducting at temperatures less than one hundred milliKelvin on an insulating substrate; and
   depositing a second layer of material comprising an alloy of transition metals, the alloy comprising at least two of titanium, vanadium, zirconium, niobium, molybdenum, hafnium, tungsten, tantalum, and rhenium, that remains resistive at temperatures less than one hundred milliKelvin, the second layer of material being in contact with the first layer of material.

8. The method of claim 7, wherein the first layer of material is deposited prior to the second layer of material.

9. The method of claim 7, wherein the second layer of material is deposited prior to the first layer of material.

10. The method of claim 7, an atomic ratio of the transition metals comprising the alloy being selected such that a ratio of the number of valance electrons to atoms within the alloy is between about 5.35 and about 5.95.

11. The method of claim 7, wherein the alloy of transition metals is an alloy of titanium and tungsten having an atomic ratio of approximately five atoms of tungsten to each atom of titanium.

12. The method of claim 7, further comprising depositing the second layer of material via a sputtering process performed at room temperature in argon gas.

13. The method of claim 7, further comprising etching the second layer of material via a reactive ion etching process with fluorine-based gases.

14. The method of claim 7, further comprising depositing a layer of an insulator material over the first and second layers of material.

15. The method of claim 7, wherein the insulating substrate is a silicon wafer.

16. An integrated circuit comprising:
   a circuit element formed from a superconducting material; and
   a resistor connected to the circuit element, the resistor being formed from an alloy of transition metals having an atomic ratio selected such that a ratio of the number of valance electrons to atoms within the alloy is between about 5.35 and about 5.95.

17. The integrated circuit of claim 16, wherein the transition metals comprising the alloy are selected as at least two of titanium, vanadium, zirconium, niobium, molybdenum, hafnium, tungsten, tantalum, and rhenium.

18. The integrated circuit of claim 17, wherein the alloy is an alloy of titanium and tungsten.

19. The integrated circuit of claim 18, wherein the alloy comprises an atomic ratio of approximately five atoms of tungsten to each atom of titanium.

20. The integrated circuit of claim 16, wherein the integrated circuit is configured for operation at temperatures less than one hundred milliKelvin, such that the integrated material has substantially no resistance at temperatures less than one hundred milliKelvin and the alloy of transition metals is resistive at temperatures less than one hundred milliKelvin.

21. The integrated circuit of claim 1, an atomic ratio of the transition metals comprising the alloy being selected such that a ratio of the number of valance electrons to atoms within the alloy is about 5.83.

* * * * *